United States Patent [19]

Taira

[11] Patent Number: 5,068,686
[45] Date of Patent: Nov. 26, 1991

[54] COLOR IMAGE RECORDING APPARATUS HAVING TRIAL PRINTING WITH VARIABLE EXPOSURE

[75] Inventor: Hiroshi Taira, Ichinomiya, Japan
[73] Assignee: Brother Kogyo Kabushiki Kaisha, Japan
[21] Appl. No.: 630,220
[22] Filed: Dec. 19, 1990
[30] Foreign Application Priority Data
  Feb. 7, 1990 [JP] Japan ............................ 2-11859
[51] Int. Cl.$^5$ .................. G03B 27/32; G03B 27/52
[52] U.S. Cl. ............................... 355/32; 355/27; 355/35
[58] Field of Search ..................... 355/32, 35, 27

[56] References Cited

U.S. PATENT DOCUMENTS

| | | |
|---|---|---|
| 4,810,614 | 3/1989 | Sangyoji et al. |
| 4,942,419 | 7/1990 | Nakai et al. |
| 4,956,662 | 9/1990 | Sakai et al. ........................... 355/27 |
| 4,967,227 | 10/1990 | Suzuki et al. ........................ 355/32 |

*Primary Examiner*—Monroe H. Hayes
*Attorney, Agent, or Firm*—Oliff & Berridge

[57] ABSTRACT

A color image recording apparatus records a color image on a photosensitive recording medium by repeating exposure against the photosensitive recording medium successively through mask members for red (R), green (G) and blue (B) images. The apparatus includes a memory having two (or more) conversion tables (I) and (II) for exposure conditions to be set on a panel surface by an operator. The conversion table (I) indicates exposure scanning speed corresponding to the exposure conditions to be set on the panel surface, and the conversion table (II) indicates one or plural stages of different scanning speeds correlative with each of the scanning speeds indicated by the conversion table (I). In deciding the exposure conditions by trial printing, a trial print mode is set, and keys are operated to carry out exposure per image area in plural stages of scanning speeds defined in the conversion tables (I) and (II). Accordingly, the number of sheets required for the trial printing can be reduced, and the setting of the exposure conditions can be quickly carried out.

12 Claims, 5 Drawing Sheets

| RED | | GREEN | | BLUE | |
|---|---|---|---|---|---|
| LEVEL | SPEED | LEVEL | SPEED | LEVEL | SPEED |
| 1 | VR1 | 1 | VG1 | 1 | VB1 |
| 2 | VR2 | 2 | VG2 | 2 | VB2 |
| 3 | VR3 | 3 | VG3 | 3 | VB3 |
| 4 | VR4 | 4 | VG4 | 4 | VB4 |
| 5 | VR5 | 5 | VG5 | 5 | VB5 |
| 6 | VR6 | 6 | VG6 | 6 | VB6 |
| 7 | VR7 | 7 | VG7 | 7 | VB7 |
| 8 | VR8 | 8 | VG8 | 8 | VB8 |
| 9 | VR9 | 9 | VG9 | 9 | VB9 |
| 10 | VR10 | 10 | VG10 | 10 | VB10 |

Fig.5

| RED | | GREEN | | BLUE | |
|---|---|---|---|---|---|
| TABLE(I) SPEED | TABLE(II) SPEED | TABLE(I) SPEED | TABLE(II) SPEED | TABLE(I) SPEED | TABLE(II) SPEED |
| VR1 | VR11<br>VR12 | VG1 | VG11<br>VG12 | VB1 | VB11<br>VB12 |
| VR2 | VR21<br>VR22 | VG2 | VG22<br>VG22 | VB2 | VB21<br>VB22 |
| VR3 | VR31<br>VR32 | VG3 | VG31<br>VG32 | VB3 | VB31<br>VB32 |
| VR4 | VR41<br>VR42 | VG4 | VG41<br>VG42 | VB4 | VB41<br>VB42 |
| VR5 | VR51<br>VR52 | VG5 | VG51<br>VG52 | VB5 | VB51<br>VB52 |
| VR6 | VR61<br>VR62 | VG6 | VG61<br>VG62 | VB6 | VB61<br>VB62 |
| VR7 | VR71<br>VR72 | VG7 | VG71<br>VG72 | VB7 | VB71<br>VB72 |
| VR8 | VR81<br>VR82 | VG8 | VG81<br>VG82 | VB8 | VB81<br>VB82 |
| VR9 | VR91<br>VR92 | VG9 | VG91<br>VG92 | VB9 | VB91<br>VB92 |
| VR10 | VR101<br>VR102 | VG10 | VG101<br>VG102 | VB10 | VB101<br>VB102 |

COLOR IMAGE RECORDING APPARATUS HAVING TRIAL PRINTING WITH VARIABLE EXPOSURE

BACKGROUND OF THE INVENTION

1. Field of the Invention

The present invention relates to an image recording apparatus, more particularly to a color image recording apparatus for recording a color image on a photosensitive recording medium through mask members prepared according to image information, wherein trial printing can be carried out with an exposure quantity varied in plural stages with use of the mask members.

2. Description of the Related Art

Conventionally, a color image recording apparatus for obtaining a color image with use of mask members is known, for example, from Japanese Patent Laid-open No. 1-128061 (corresponding to U.S. Patent Application Ser. No. 07/270,650 filed on Nov. 14, 1988, the disclosure of which is herein incorporated by reference). In the known recording apparatus, three mask members for red (R), green (G) and blue (B) images are prepared by a monochromatic laser printer, and they are successively one by one brought into superimposition with a photosensitive recording medium to follow repeated exposure scanning, thereby obtaining a color image.

However, the photosensitive recording medium to be used has a variation in sensitivity characteristics. Further, an exposure condition varies with a change in environment such as weather. Conventionally, an operator operates R, G and B keys provided on a control panel surface to suitably set the exposure condition by his sense and actually output an image. Then, the operator checks the output image with his eyes to adjust the exposure condition. Accordingly, until an optimum output image is obtained, the operator is obliged to carry out trial printing many times. As a result, many waste trial prints are generated to cause an uneconomical loss of output paper. Further, until the optimum output image is obtained, much time is required for setting the exposure condition. Particularly, as the trial printing in one time includes three steps of exposure operations using the R, G and B mask members, the amount of wasted time increases.

SUMMARY OF THE INVENTION

Accordingly, it is an object of the present invention to overcome the above problems and to provide a color image recording apparatus which can simplify the trial printing using the mask members to easily and quickly adjust the exposure quantity for a color image to be output.

It is another object of the present invention to provide a color image recording apparatus which can eliminate the loss of output paper to be employed for the trial printing accompanied by the adjustment of the exposure quantity.

It is a further object of the present invention to provide a color image recording apparatus which can improve efficiency by use of quick adjustment of the exposure quantity.

The above and further objects and novel features of the invention will be achieved by a color image recording apparatus for recording a color image on a photosensitive recording medium through mask members for red (R), green (G) and blue (B) images, comprising (a) a scanning exposure light source relatively movable along the photosensitive recording medium; (b) a driving source for variably moving the scanning exposure light source; (c) scanning speed setting means for setting a scanning speed of the scanning exposure light source; (d) a memory having a first conversion table (I) indicating the scanning speed to be set by the scanning speed setting means and a second conversion table (II) indicating one or plural stages of different scanning speeds corresponding with the scanning speed indicated by the first conversion table (I); (e) trial print mode inputting means for designating a trial print mode; and (f) control means for variably driving the driving source in plural stages per an image area on the basis of the scanning speeds in the first conversion table (I) and the second conversion table (II) designated by the scanning speed setting means when a trial print mode is set by the trial print mode inputting means.

With this construction, in the trial printing operation, a plurality of trial print images can be obtained in one image area by carrying out an exposure scanning operation at a plurality of scanning speeds (to obtain different exposure levels) that include the scanning speed set in the first conversion table (I) and the scanning speeds defined in the second conversion table (II) corresponding with the scanning speed in the first conversion table (I). Accordingly, an operator can easily select an optimum exposure condition by selecting one of the trial print images obtained in one image area.

BRIEF DESCRIPTION OF THE DRAWINGS

The invention will be described in detail with reference to the following drawings, wherein.

DETAILED DESCRIPTION OF THE PREFERRED EMBODIMENTS

Figure 1:
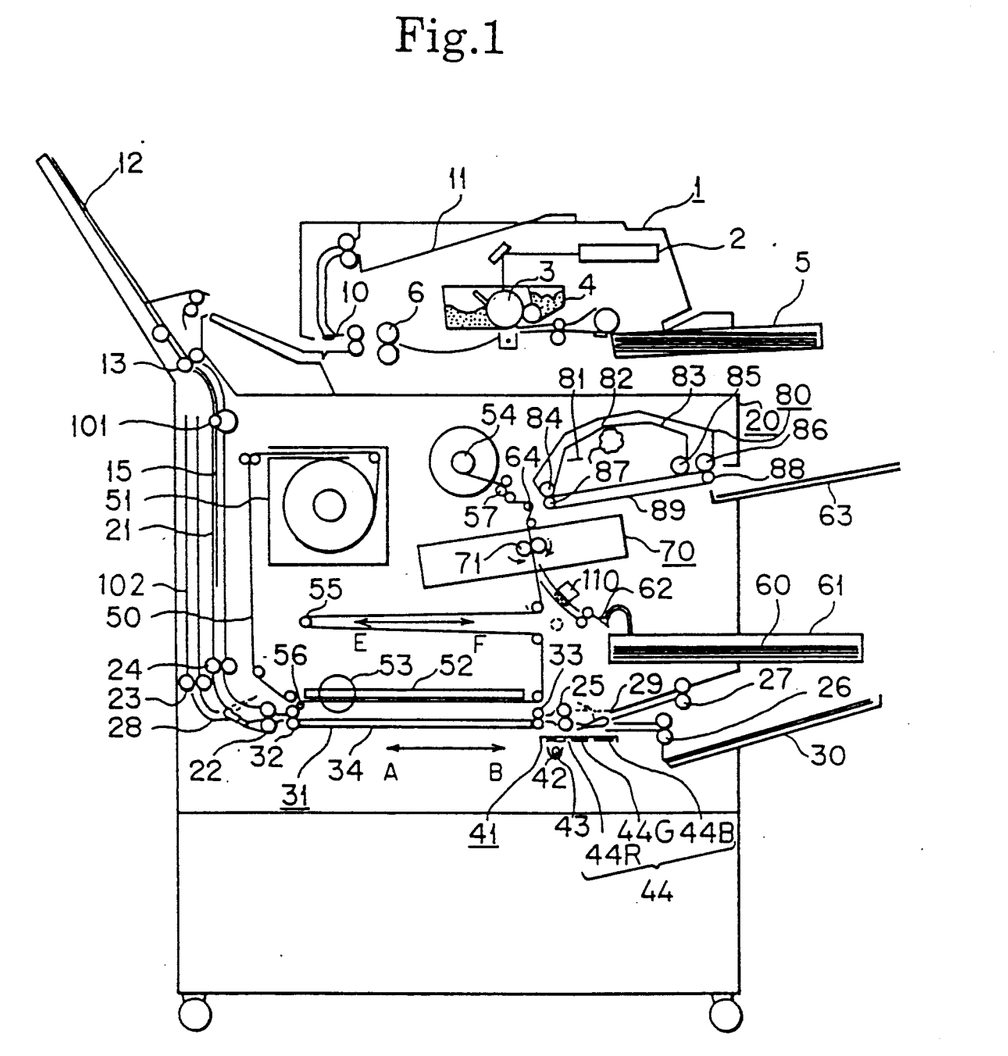
FIG. 1 is a schematic cross-sectional view showing a color image recording apparatus according to an embodiment of the present invention.

A detailed description of one preferred embodiment of the present invention will now be given referring to the accompanying drawings. As shown in FIG. 1, a monochromatic laser printer and a color image recording apparatus 20 are arranged in a coupled condition.

The monochromatic laser printer 1 is placed at the top of the color image recording apparatus 20. In the laser printer a laser beam is irradiated upon an electrically charged photosensitive drum 3 by way of a polygon scanner 2 to form an electrostatic latent image on the photosensitive drum 3. The electrostatic latent image formed on the photosensitive drum 3 is then developed by a toner developing unit 4. A toner image formed by such development is transferred to a plain paper sheet or an overhead projector (OHP) sheet supplied from a sheet cassette 5 and is then fixed to the sheet by a fixing unit 6. Normally, the monochromatic laser printer 1 records data transmitted from a host computer.

A sheet outputted from the laser printer 1 is sent out into one of two routes which is selected by a sheet path selector 10, and when a white/black image is required, the sheet is sent out into a monochromatic discharge tray 11, but when a color image is required, the sheet is sent out once into an automatic document feeder (hereinafter referred to as ADF) tray 12 and then taken into the color image recording apparatus 20 by an ADF roller 13. The sheet to be fed into the color image recording apparatus 20 is constituted of a set of three mask members 15 (15R, 15G and 15B) for red, green and blue images, and these mask members 15 are fed one by one into the recording apparatus 20 after output from the laser printer 1.

Subsequently, construction of the color image recording apparatus 20 will be described. A positioning unit 31 for positioning the mask member fed into the recording apparatus 20 is disposed in a body of the color image forming apparatus 20, and a mask member transport path 21 extends from the ADF tray 12 to the positioning unit 31. A recurler roller pair 101 for removing a curl of a mask member 15 outputted from the laser printer 1 is disposed intermediately of the mask member transport path 21. Reference numerals 22 and 24 designate mask member feeding rollers provided in the mask member transport path 21.

Figure 2:
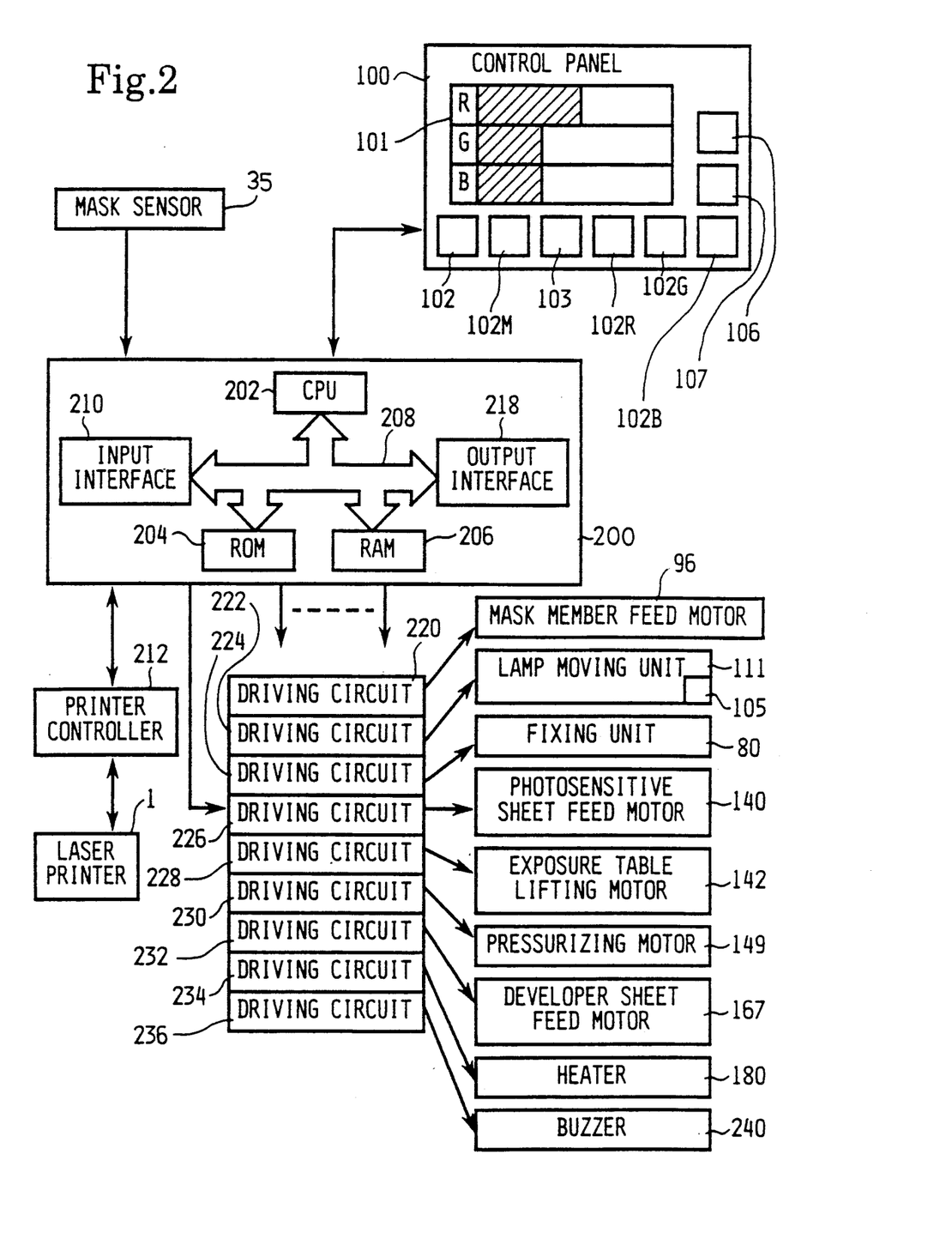
FIG. 2 is a block diagram of a controller employed in the color image recording apparatus.
Figure 3:
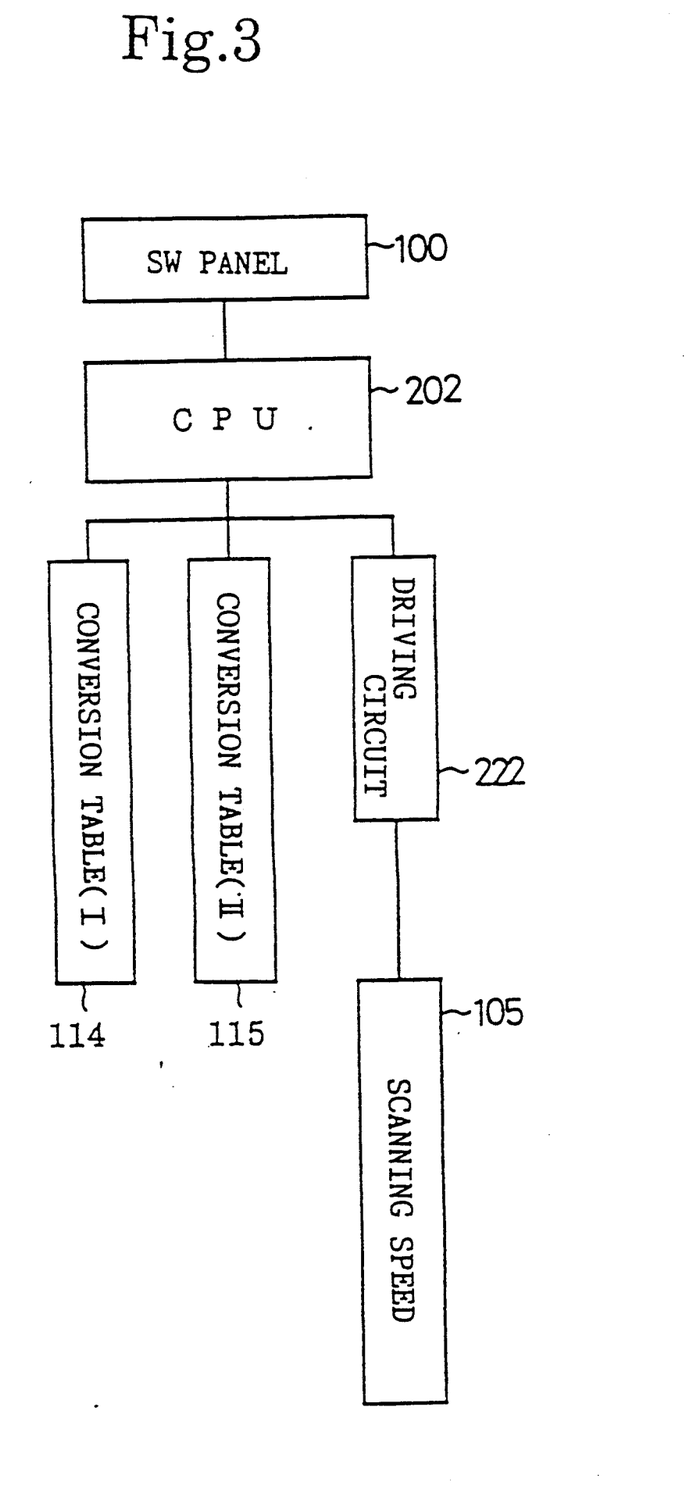
FIG. 3 is a block diagram of a part of the controller shown in FIG. 2, particularly showing the relation between the first and second conversion tables (I) and (II) in the memory incorporated in the controller.

The positioning unit 31 includes a known sensor 35 for detecting the mask member 15 as shown in FIG. 2, the roller pairs 32 and 33 disposed adjacent left and right end portions of the positioning unit 31, a glass plate 34 disposed between the roller pairs 32 and 33, and so forth. A gate 28 is provided at a lower end of the path 21, and the gate 28 is in a selected position shown by a solid line in FIG. 1 when the mask member 15 is fed into the positioning unit 31.

An exposure device 41 is disposed below the positioning unit 31 such that it is movable in leftward and rightward directions along the positioning unit 31 as indicated by the arrows A, B. The exposure device 41 is constituted by a linear white light source (hereinafter referred to only as lamp) 42, a reflecting member 43 for reflecting light from the lamp 42, and a filter unit 44 including a red filter 44R, a green filter 44G and a blue filter 44B.

A photosensitive recording medium 50 is composed of a web serving as a base material, and photosetting resin material and microcapsules applied to the web. The photosetting resin material contains, as a main material, such photosetting resin including a photopolymerization initiator as is known, for example, by Japanese Patent Laid-Open No. 143044/1987, and it is hardened by light of wavelengths of red, green and blue. Meanwhile, the microcapsules individually contain dye precursors of cyan, magenta and yellow therein. The photosensitive recording medium 50 is accommodated in a cartridge 51 such that it may not be exposed to light. The photosensitive recording medium 50 is drawn out from the cartridge 51 and is first passed between the glass plate 34 and an exposure table 52 and then wound around a takeup roller 54 past a buffer 55, a pressure developing unit 70, a separating roller 64 and a drive roller 57. When an exposing operation is to be performed by the exposure device 41, the mask member 15R is first fed to a given exposure position by the roller pair 32 of the positioning unit 31, and then an exposure table 52 is moved down by a cam 53 so that a mask member which has been transported onto the glass plate 34 is closely contacted with the photosensitive recording medium 50. Meanwhile, a fastening roller 56 is located adjacent a left end of the exposure table 52 so that, when the exposure table 52 is moved down to a predetermined position, the fastening roller 56 is pressed against a left end portion of the exposure table 52. As a result, while an exposing operation is being performed by way of a mask member 15R, 15G or 15B, the photosensitive recording medium 50 is held between and fixed by the exposure table 52 and fastening roller 56.

When the exposure table 52 is brought into close contact with the positioning unit 31, the lamp 42 is turned on. Then, the exposure device 41 is moved across an image area in a direction of arrow A to carry out exposure through the red filter 44R and the mask member 15R to the photosensitive recording medium 50. When the exposure for the red image information is ended, the lamp 42 is turned off, and the exposure device 41 is moved back in a direction of arrow B. At this time, the filter unit 44 of the exposure device 41 is located so that the green filter 44G is positioned above the lamp 42. Simultaneously, the exposure table 52 is lifted by the rotation of the cam 53, so that the photosensitive recording medium 50 is brought into separation from the positioning unit 31 and the mask member 15R. The photosensitive recording medium 50 is wound around a roll under a back tension in the cartridge 51. Accordingly, when the exposure table 52 is lowered, a length of the medium 50 corresponding to a lowering amount of the exposure table 52 is taken out of the cartridge 51, while when the exposure table 52 is lifted after the end of the exposure, the medium 50 is rewound into the cartridge 51.

Even after the end of the exposure through the red mask member 15R, the exposure table 52 is lifted to a predetermined position, and the photosensitive recording medium 50 remains fixed to the exposure table 52 by the fastening roller 56.

In the next stage, when the green mask member 15G output from the monochromatic laser printer 1 is fed through the mask member transport path 21 to a position just before the roller pair 24, the red mask member 15R is fed out of the positioning unit 31, and simultaneously the green mask member 15G is fed to the exposure position to be stopped.

A mask member discharge tray 30 for receiving a used mask member 15 discharged from the image forming apparatus 20 is provided on the outer side of the body of the image forming apparatus 20. Reference numerals 25 and 27 designate mask member discharge rollers provided in the mask member discharge path. Further, reference numeral 29 designates a gate provided in the discharge path, and the gate 29 is in a position shown by a solid line in FIG. 1. If the conditions are so set as to successively obtain a plurality of color copies, the mask member 15R is maintained in a nipped condition by the roller pairs 27.

In the same manner as in the case of the mask member 15R, the mask member 15G guided to the positioning unit 31 is positioned relative to the photosensitive recording medium 50. Then, the exposure table 52 is lowered to come into close contact with the photosensitive recording medium 50. Then, the lamp 42 is turned on to carry out exposure of green light through the green filter 44G and the mask member 15G to the medium 50 under the same control as mentioned above. After the end of the exposure, the exposure table 52 is lifted to the predetermined position. The exposure device 41 is returned to the original position, and the filter unit 44 is moved so that the blue filter 44B is positioned above the lamp 42.

Then, the blue mask member 15B output from the monochromatic laser printer 1 is transported to a position just before the roller pair 24. Under this condition, the mask member 15G is fed out of the positioning unit 31, and the mask member 15B is fed to the exposure position and stopped. At this time, the gate 29 is in a position shown by a dashed line in FIG. 1. Accordingly, the mask member 15G after exposure is discharged through a roller pair 26 provided in another discharge path leading to the tray 30. In the case where a plurality of color copies are intended to be successively obtained, the mask member 15G is maintained in a nipped condition by the roller pair 26.

The mask member 15B guided into the positioning unit 31 is brought into close contact with the photosensitive recording medium 50 in the same manner as mentioned above. Then, the photosensitive recording medium 50 is exposed by blue light through the mask member 15B and the blue filter 44B.

Thus, the latent image of a desired color image is recorded on the photosensitive recording medium 50.

In the next stage, the exposure table 52 is lifted to the original position to separate the fastening roller 56 from the left end of the exposure table 52 and move the buffer 55 in a direction shown by an arrow E. As a result, an unexposed portion of the photosensitive recording medium 50 having a length corresponding to one image area is taken out of the cartridge 51 to the under side of the exposure table 52. On the other hand, the exposed portion of the photosensitive recording medium 50 is fed to the pressure developing unit 70 so that a leading end of the latent image reaches the pressure roller 71 in the pressure developing unit 70 to be stopped at this position.

Color developer sheets 60 are each constituted by a color developer (as disclosed, for example, in U.S. Pat. No. 4,399,209) applied to base paper, and set in the cassette 61 such that a face thereof to which the color developer is applied is directed downwardly. Such color developer sheets 60 are taken out and supplied into the pressure developing unit 70 one by one from the cassette 61 by a suction cup 62 which is intermittently driven by a driving source 167 as shown in FIG. 2. Then, the color developer sheet 60 is pressurized by a pair of pressure rollers 71 of the pressure developing unit 70 while it is held in an overlapping relationship with the photosensitive recording medium 50 after exposure to light. Consequently, a latent image formed on the photosensitive recording medium 50 by an exposing operation is changed into a visible image on the color developer sheet 60.

During the pressure developing operation, the exposure table 52 is lowered again to the predetermined position, and the photosensitive recording medium 50 is fixed to the exposure table 52 by the fastening roller 56. While the photosensitive recording medium 50 overlapping the color developer sheet 60 is being fed under pressure, the buffer 55 is moved in a direction of arrow F in FIG. 1. The color developer sheet 60 after the developing operation is separated from the photosensitive recording medium 50 by the separating roller 64, and is then guided into a thermal fixing unit 80.

A thermal fixing unit 80 is constituted from a casing 83 in which a heater 81 and a vane wheel 82 are located, an endless belt 89 for the transportation of a color developer sheet 60 extending between a pair of rollers 87 and 88, and rubber rollers 84, 85 and 86.

The color developer sheet 60 sent out from the pressure developing unit 70 and separated from the photosensitive recording medium 50 by the separating roller 64 is then glazed by the thermal fixing unit 80 and then discharged onto a discharge tray 63.

During a series of the developing and glazing processes as mentioned above, the photosensitive recording medium 50 is fixedly nipped between the exposure table 52 and the fastening roller 56. Accordingly, while the developing operation for one image area is being carried out, the exposing operation of a latent image for the next color image can be carried out in the exposing unit.

That is, when the exposing operation for the next color image is intended to be carried out, the mask member 15B located in the exposure position is first discharged into the path 21, and the mask member 15R retained by the roller pair 27 is fed into the positioning unit 31 by reversely driving the roller pair 27. At this time, the gates 28 and 29 are in the positions of the solid lines, and the mask member 15B is maintained in the nipped condition by the roller pair 24 in the path 21. The mask member 15R fed into the positioning unit 31 is positioned to be brought into close contact with the photosensitive recording medium 50. Then, the photosensitive recording medium 50 is exposed to the red light through the mask member 15R.

Then, the mask member 15R located in the exposure position is discharged leftwardly into the path 102, and is retained by the roller pair 23. On the other hand, the mask member 15G retained by the roller pair 26 is fed into the positioning unit 31 by reversely driving the roller pair 26. The mask member 15G fed into the positioning unit 31 is positioned to be brought into close contact with the photosensitive recording medium 50. Then, the photosensitive recording medium 50 is exposed to the green light through the mask member 16G.

Then, the mask member 15G located in the exposure position is discharged rightwardly, and the mask member 15B retained by the roller pair 24 in the path 21 is fed into the positioning unit 31. Then, the photosensitive recording medium 50 is exposed to the blue light through the mask member 15B in the same manner as the above. Thus, a latent image of the color image is formed on the photosensitive recording medium 50. Then, the latent image is developed onto the color developer sheet 60 in the same manner as the above.

By repeating the above operation, a desired number of color copies can be output by using the set of mask members 15.

After obtaining the desired number of color copies from the set of mask members 15, each of the mask members 15 is discharged through the roller pair 27 or the roller pair 26 to the discharge tray 30.

In the case where the next set of mask members 15 is output from the monochromatic laser printer 1 during the exposing operation of the present color image, the mask members 15 are once stored on the ADF tray 12. After the exposing operation of the present color image is ended, the mask members 15 stored on the ADF tray 12 are fed one by one into the color image recording apparatus 20 by the ADF feed rollers 13.

Further, in the case where mask members output from another monochromatic laser printer or mask members previously used are used again, they are set on the ADF tray 12 to thereby carry out inputting into the color image recording apparatus 20.

The operation of the image recording apparatus is controlled by a controller 200 (FIG. 2). A microcomputer comprising a CPU 202, a ROM 204, a RAM 206 and a bus 208 interconnecting these devices is the principal component of the controller 200. An input interface 210 is connected to the bus 208. A monochromatic printer controller 212 for controlling a monochromatic printer 1, an input panel 100, and sensor 35 for detecting the mask member 15 are connected to the input interface 210.

The input panel 100 is provided with a display 101 for displaying set modes including light exposures, and a selector key 102 for trial print setting modes. The input panel 100 may also include a start key 103. The display 101 has a liquid crystal panel which displays the respective densities (light quantities) of red, green and blue images in a bar graph. Longer bars in the bar graph indicate higher densities (greater light quantities). A finish print mode selector key 102M is depressed to display the set mode of the image recording apparatus 20 and light exposures successively. Indicated at 102R, 102G and 102B are red, green and blue light exposure setting keys, at 106 is a light exposure increasing key, and at 107 is a light exposure reducing key. These selector keys are the components of the light exposure setting means.

Connected to an output interface 218 connected to the bus 203 are driving circuits 220, 222, 224, 226, 228, 230, 232, 234 and 236, which in turn are connected respectively to a mask member feed motor 96, a lamp moving unit III for operating the scanning motor 105 to move the lamp 42 at a predetermined scanning speed set by the scanning speed data in the ROM 204, a fixing unit 80, a photosensitive pressure sensitive sheet feed motor 140, an exposure table lifting unit 142, a pressurizing motor 149, developing sheet feed motor 167, a heater 180 and a buzzer 240. When a developing sheet 60 is jammed, the buzzer 240 sounds to inform the operator. The jam information and other necessary information are displayed on a LCD 101.

The RAM 206 having a work area stores control flags for operating the control process.

Figure 4:
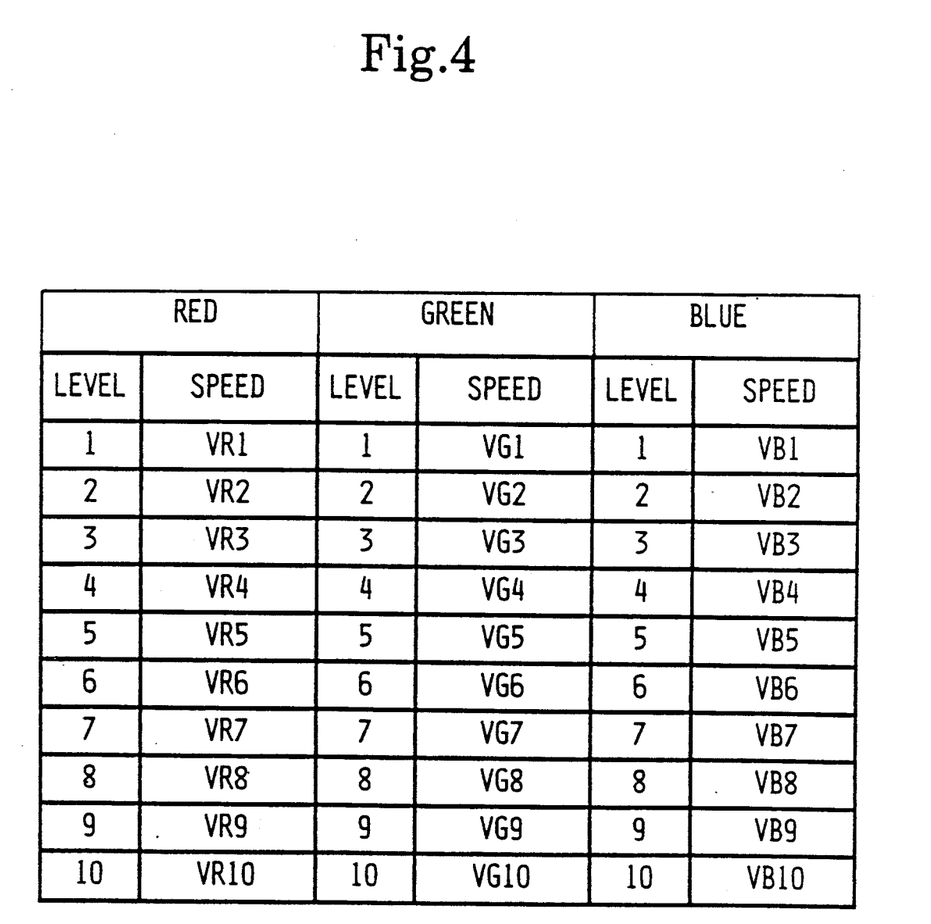
FIG. 4 is an illustration showing the content of the first conversion table (I)
Figure 5:
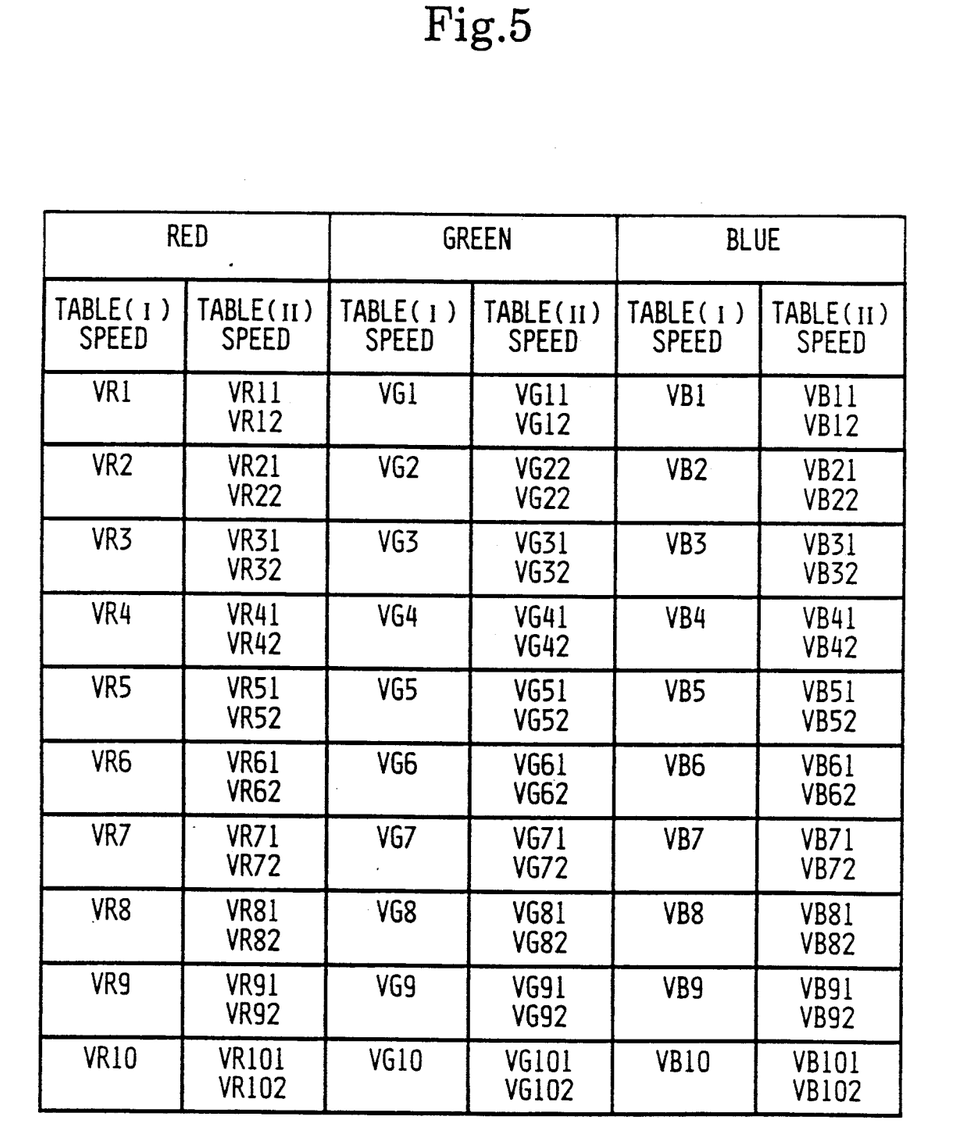
FIG. 5 is an illustration showing the content of the second conversion table (II).

The ROM 204 stores two data conversion tables (I) 114 and (II) 115 for converting light exposure data into scanning speed data (FIGS. 4 and 5). The conversion table (I) 114 correlates for each color mode, a particular light exposure level with a particular scanning speed at the first stage as shown in FIG. 4. For example, exposure level 4 for the red mode has a corresponding scanning speed VR4.

In this case, it is assumed that the trial print mode setting key 102 has been operated, and the conversion table (I) means that the exposure device 41 is controlled by the CPU 202 to scan a range corresponding to ⅓ of the image area at the speed of VR4.

FIG. 5 shows the relationship between the scanning speed set in the conversion table (I) and two stages of higher scanning speeds set in the conversion table (II) for each of red (R), green (G) and blue (B) modes. For example, when the scanning speed for the R mode is set to VR4 in the conversion table (I), the higher scanning speeds are set to VR41 and VR42 in the conversion table (II). As a result, while the range corresponding to ⅓ of the image area is exposed at the scanning speed of VR4 by the exposure device 41 as mentioned above, the next range corresponding to another ⅓ of the image area is exposed at the scanning speed of VR41, and the next range corresponding to the remaining ⅓ of the image area is exposed at the scanning speed of VR42. In this case, if the two stages of scanning speeds set by conversion table II are stepwise higher (VR41=VR5 and VR42=VR6 are set, for example), the trial print for R image can be obtained by one exposure scanning operation at the three stages of scanning speeds of VR4, VR5 and VR6 set in the conversion table (I).

In the G mode and the B mode, the trial print can be similarly obtained. For example, when the G mode is designated on the panel surface, and the exposure level is selected to 3, the first ⅓ of the image area is exposed at the scanning speed of VG3, and the next ⅓ of the image area is exposed at the scanning speed of VG31 (=VG4), and the last ⅓ of the image area is exposed at the scanning speed of VG32 (=VG5). The G image thus obtained by the exposure is overlapped with the R image previously obtained. Similarly in the B mode, the B image is overlapped with the G image by the exposure at the three stages of scanning speeds to be set by designating the exposure levels on the panel surface. Consequently, three kinds of exposed samples can be obtained in one image area. In the above-mentioned trial printing for each of the R, G and B modes, the red (R) mask member 15R, the green (G) mask member 15G and the blue (B) mask member 15B are set in the exposure position, respectively. After the trial printing for the R mode is carried out by using the mask member 15R, the mask member 15R is retained for waiting in the nipped condition by the roller pair 27 in the first discharge path. Then, after the trial printing for the G mode is carried out by using the mask member 15G, the mask member 15G is retained for waiting in the nipped condition by the roller pair 26 in the second discharge path. Then, after the trial printing for the B mode is carried out by using the mask member 15B, the mask member 15B is retained for waiting in the nipped condition by the roller pair 24 in the path 21.

In the subsequent finish printing, the exposed samples are checked by the operator, and the exposure conditions for the color image to be desired are selected by operating the keys 102R, 102G and 102B and the light exposure increasing key 106 or the light exposure reducing key 107 on the panel surface. Then, the finish print mode selector key 102M is depressed (i.e., the trial print mode is canceled), and the start key 103 is depressed to thereby obtain a desired output image. That is, when the start key 103 is depressed after setting the exposure conditions, the mask member 15R is fed to the exposure device by the reverse rotation of the roller pair 27, and the photosensitive recording medium 50 is exposed through the mask member 15R at the set scanning speed. After the exposure through the mask member 15R is ended, the mask member 15G is fed to the exposure device by the reverse rotation of the roller pair 26 to carry out the exposure through the mask member 15G. Then, after the exposure through the mask member 15G is ended, the mask member 15B is fed to the exposure device by the forward rotation of the roller pair 24 to carry out the exposure through the mask member 15B. Thereafter, as mentioned previously, the latent image on the photosensitive recording medium 50 is developed under pressure to the color developer sheet 60, and the developed image is fixed to obtain the desired output image.

The present invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein. For instance, the photosensitive recording medium may be moved under the condition where the scanning exposure light source is fixed.

What is claimed is:

1. A color image recording apparatus for recording a color image on a photosensitive recording medium through mask members for red (R), green (G) and blue (B) images, comprising:
    a scanning exposure light source relatively movable along an image area of said photosensitive recording medium;
    a driving source for moving said scanning exposure light source at variable scanning speeds;
    scanning speed setting means for setting a scanning speed of said scanning exposure light source;
    a memory having a first conversion table indicating the scanning speed to be set by said scanning speed setting means and a second conversion table indicating at least one of a different scanning speed correlative with the scanning speed indicated by said first conversion table;
    trial print mode inputting means for designating a trial print mode; and
    control means for variably driving said driving source in plural stages per image area on the basis of the scanning speeds in said first conversion table and said second conversion table designated by said scanning speed setting means when the trial print mode is set by said trial print mode inputting means, a number of plural stages per image area to be scanned corresponding to a number of scanning speeds designated by said first and second conversion tables.

2. The color image recording apparatus according to claim 1, wherein said first conversion table indicates plural stages of scanning speeds for each of the R, G and B images, and said second conversion table indicates two stages of different scanning speeds correlative with each of said plural stages of scanning speeds indicated by said first conversion table for each of the R, G and B images.

3. The color image recording apparatus according to claim 2, wherein said scanning speed setting means comprises inputting key means for setting the scanning speeds indicated by said first conversion table individually for the R, G and B images.

4. The color image recording apparatus according to claim 2, wherein said two stages of different scanning speeds indicated by said second conversion table are stepwise higher than the corresponding scanning speed indicated by said first conversion table.

5. The color image recording apparatus according to claim 1, wherein trial printing in said trial print mode is carried out for each of said mask members for the R, G and B images.

6. The color image recording apparatus according to claim 1, further comprising:
    finish print mode inputting means for designating a finish print mode; and
    control means for driving said driving source per image area on the basis of the scanning speed in said first conversion table designated by said scanning speed setting means when the finish print mode is set by said finish print mode inputting means.

7. A color image recording apparatus for recording a color image on a photosensitive recording medium through mask members for red (R), green (G) and blue (B) images, comprising:
    a scanning exposure light source relatively movable along an image area of said photosensitive recording medium;
    scanning speed setting means for setting a scanning speed of said scanning exposure light source;
    a memory having first and second conversion tables, said first conversion table indicating the scanning speed to be set by said scanning speed setting means, and said second conversion table indicating at least one stage of a different scanning speed correlative with the scanning speed indicated by said first conversion table; and
    control means for varying the scanning speed of said scanning exposure light source in plural stages of scanning speeds corresponding to the scanning speed in said first conversion table designated by said scanning speed setting means and the at least one different scanning speed in said second conversion table.

8. The color image recording apparatus according to claim 7, wherein the control means sets the scanning speed of the light source to the scanning speed of the first conversion table for one portion of an image area to be scanned, and sets the scanning speed of the light source to the at least one scanning speed of the second conversion table for remaining portions of the image area to be scanned.

9. The color image recording apparatus according to claim 8, wherein a number of portions of said image area to be scanned corresponds to a number of scanning speeds designated by said first and second conversion tables.

10. A color image recording apparatus for recording a color image on a photosensitive recording medium through mask members for red (R), green (G) and blue (B) images, comprising:
    exposing means for irradiating light from a scanning exposure light source through one of said mask members onto said photosensitive recording medium while relatively moving said scanning exposure light source along an image area of said photosensitive recording medium;
    scanning speed setting means for setting a scanning speed of said scanning exposure light source;
    a memory having a first conversion table indicating the scanning speed to be set by said scanning speed setting means and a second conversion table indicating at least one stage of a different scanning speed correlative with the scanning speed indicated by said first conversion table;
    trial print mode inputting means for designating a trial print mode;
    mask member feeding means for feeding one of said mask members for trial printing into said exposure means when a trial print mode is set by said trial print mode inputting means; and
    control means for varying the scanning speed of said scanning exposure light source in plural stages per image area on the basis of the scanning speeds in said first conversion table and said second conversion table designated by said scanning speed setting means after said mask member for trial printing is fed into said exposing means by said mask member feeding means.

11. The color image recording apparatus according to claim 10, wherein the control means sets the scanning speed of the light source to the scanning speed of the first conversion table for one portion of an image area to be scanned, and sets the scanning speed of the light source to the at least one scanning speed of the second conversion table for remaining portions of the image area to be scanned.

12. The color image recording apparatus according to claim 11, wherein a number of portions of said image area to be scanned corresponds to a number of scanning speeds designated by said first and second conversion tables.

* * * * *